(12) United States Patent
Bok et al.

(10) Patent No.: US 6,916,594 B2
(45) Date of Patent: Jul. 12, 2005

(54) OVERCOATING COMPOSITION FOR PHOTORESIST AND METHOD FOR FORMING PHOTORESIST PATTERN USING THE SAME

(75) Inventors: Cheol Kyu Bok, Gyeonggi-do (KR); Jae Chang Jung, Seoul (KR); Seung Chan Moon, Gyeonggi-do (KR); Ki Soo Shin, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 10/722,815

(22) Filed: Nov. 26, 2003

(65) Prior Publication Data

US 2004/0142279 A1 Jul. 22, 2004

(30) Foreign Application Priority Data

Dec. 30, 2002 (KR) ................................ 10-2002-0087205
Jun. 24, 2003 (KR) ................................ 10-2003-0041167

(51) Int. Cl.$^7$ .............................................. G03C 1/492
(52) U.S. Cl. ................................ 430/270.1; 430/271.1; 430/273.1; 430/311; 430/330

(58) Field of Search ......................... 430/270.1, 271.1, 430/273.1, 311, 330

(56) References Cited

U.S. PATENT DOCUMENTS 6,416,930 B2 * 7/2002 Wakiya et al. ........... 430/273.1
6,673,517 B2 * 1/2004 Nishi et al. .............. 430/270.1

* cited by examiner

*Primary Examiner*—Amanda Walke
(74) *Attorney, Agent, or Firm*—Marshall, Gerstein & Borun LLP (57) ABSTRACT

Overcoating compositions for photoresist and methods for reducing linewidth of the photoresist patterns are disclosed. More specifically, an overcoating composition containing acids is coated on a whole surface of a photoresist pattern formed by a common lithography process to diffuse the acids into the photoresist pattern. The photoresist in the portion where the acids are diffused is developed with an alkali solution to be removed. As a result, the linewidth of positive photoresist patterns can be reduced, and the linewidth of negative photoresist patterns can be prevented from slimming in a subsequent linewidth measurement process using SEM.

16 Claims, 9 Drawing Sheets

OVERCOATING COMPOSITION FOR PHOTORESIST AND METHOD FOR FORMING PHOTORESIST PATTERN USING THE SAME

BACKGROUND

1. Technical Field

Overcoating compositions for photoresist and methods for reducing linewidth of the photoresist patterns are disclosed. More specifically, an overcoating composition containing acids is coated on a whole surface of a photoresist pattern formed by a common lithography process to diffuse the acids into the photoresist pattern. The regions of photoresist pattern where the acids are diffused are developed with an alkali solution to be removed. As a result, the linewidth of positive photoresist patterns can be reduced, and the linewidth of negative photoresist patterns can be prevented from slimming in a subsequent linewidth measurement process using SEM.

2. Description of the Related Art

Conventionally, exposure energy has been increased to reduce linewidth of photoresist patterns.

Figure 1:
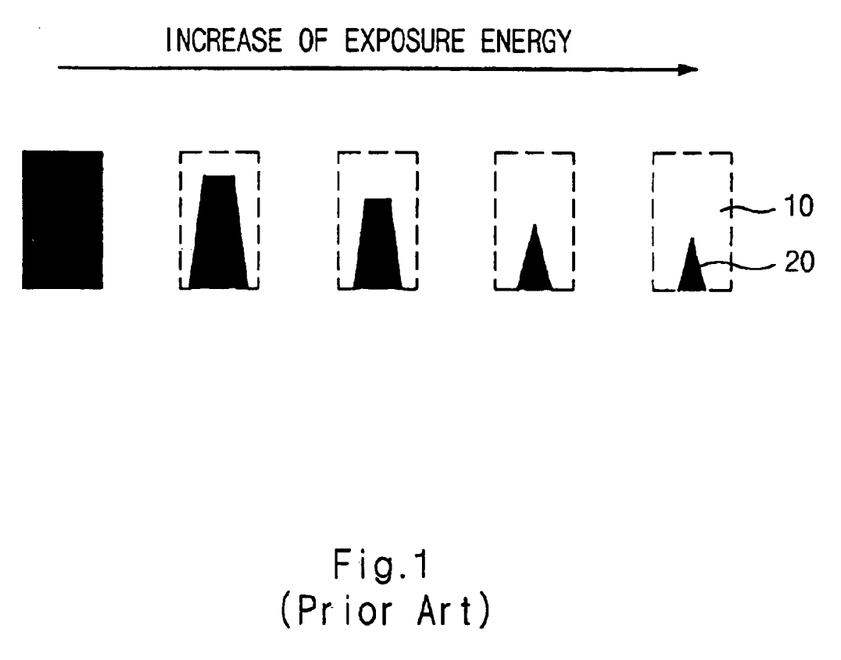
FIG. 1 is a diagram showing the change process of the linewidth and profile of a photoresist pattern according to increase of exposure energy.

However, although the above method is very effective to reduce the linewidth of photoresist patterns, the amount of light diffracted according to increase of the energy becomes larger as shown in FIG. 1. As a result, a portion of the photoresist pattern is removed (10), and the photoresist pattern 20 is transformed with a triangle type. Also, the thickness of the photoresist pattern 20 is reduced.

The triangular profile and the reduction of resist thickness degrade subsequent etching processes. Specifically, when the linewidth of the pattern is measured, the triangle-type pattern degrades reproducibility, and is transcribed into lower films to transform subsequent etching patterns into triangle-types. As a result, resistance increases.

The reduction of resist thickness disables a mask function on plasma in a process of etching lower films. As a result, etching patterns are transformed and broken.

When negative photoresist patterns are formed, a SEM measurement is performed by setting a critical dimension (hereinafter, referred to as 'CD') target. The CD soon after the SEM measurement is almost identical with the target. However, in 10 minutes after the SEM measurement, the pattern CD decreases due to electronic beam of high energy generated in photoresist composition during the measurement process.

The pattern CD more decreases due to far ultraviolet light sources such as ArF (193 nm) and VUV (157 nm) in the semiconductor manufacture for ultrafine high integration.

Most photoresist compositions for 193 nm and 157 nm which satisfy various physical properties such as low light absorbance, high etching, excellent substrate adhesiveness, transparency to light sources and development capability in alkali developers do not include aromatic materials which alleviate electronic beams of high energy generated from the SEM measurement process. As a result, the pattern CD decreases.

The pattern CD more decreases due to accelerating voltage of electronic beams and exposure time as patterns become smaller, which result in a degradation of the yield for the process.

SUMMARY OF THE DISCLOSURE

Overcoating compositions which may reduce linewidth of photoresist patterns are disclosed.

Methods for forming photoresist patterns using the disclosed overcoating compositions are disclosed.

DETAILED DESCRIPTION OF THE PREFERRED EMBODIMENTS

Overcoating compositions for photoresist comprising a water-soluble polymer, an acidic compound and water are disclosed.

Preferably, the water-soluble polymer is a compound of Formula 1 or polyvinylpyrrolidone:

Formula 1 wherein

R' is H or $CH_3$;

$R_5$ and $R_6$ individually are H or a $C_1$–$C_3$ alkyl group; and n is number of repeating unit.

The n is an integer ranging from 50 to 150 and molecular weights of compound of the Formula 1 ranges from 5000 to 15000.

The compound of Formula 1 is preferably poly(N,N-dimethylacrylamide).

The acidic compound may be an organic sulfonic acid, for example, p-toluenesulfonic acid monohydrate. The acidic compound is present in an amount ranging from 2 to 20 wt %, preferably, ranging from 5 to 10 wt % base on the amount of the water-soluble polymer present.

Distilled water may be used for the water which is a solvent of the composition. The water is present in an amount ranging from 500 to 4000 wt %, preferably, ranging from 500~2000 wt % base on the amount of the water-soluble polymer present.

A method for forming a photoresist pattern comprises:

(a) forming a photoresist pattern by a lithography process;

(b) coating the overcoating composition described above on the whole surface of the photoresist pattern to form a overcoating layer;

(c) baking the overcoating layer; and (d) developing the overcoating layer with an alkaline developing solution.

The step (a) wherein a photoresist pattern is formed by a lithography process comprises:

(a-1) coating a chemically amplified photoresist composition on a semiconductor substrate and baking the substrate to form a photoresist film;

(a-2) exposing the photoresist film to light;

(a-3) baking the photoresist film; and (a-4) developing the photoresist film.

Preferably, the height of the photoresist pattern obtained from the step (a) coated in the step (a-1) ranges from 2000 to 3000 Å, and the thickness of the overcoating layer in the step (b) ranges from 200 to 5000 Å from the top surface of the photoresist pattern of the step (a).

The bake process of the step (c) as an acid diffusion bake process is preferably performed at a temperature ranging from 50 to 150° C. for 30 to 90 seconds.

The bake process is performed in order to diffuse acids existing on the overcoating layer into the photoresist pattern. As a result, regions of photoresist pattern having acids are increased, and they may be removed with an alkaline developing solution. Here, as the temperature of the acid diffusion bake process becomes higher and the thickness of the overcoating layer becomes thicker, the acid diffusion distance becomes longer. Accordingly, the linewidth of patterns may be regulated by using the above-described principle.

The alkaline developing solution of the step (d) may be TMAH, KOH or NaOH aqueous solution.

Conventionally, an overcoating composition is coated on a photoresist film before formation of a photoresist pattern, and then a subsequent photolithography process is performed.

However, after a photoresist pattern is formed by a common lithography process, the disclosed overcoating composition is coated on the whole surface of the photoresist pattern. Then, the baking process is performed to obtain a fine pattern.

That is, the disclosed composition is formed on the whole surface of the photoresist pattern, and then the baking process is performed to diffuse acids into the photoresist pattern. Then, the regions of photoresist pattern where the acids are diffused are removed with an alkaline developing solution. As a result, the linewidth of the pattern may be reduced.

After a negative pattern is formed, the disclosed overcoating composition is coated thereon. Then, a baking process is performed on the resulting structure. As a result, acids included in the composition are absorbed into the upper portion of the pattern, and the pattern is hardened. The SEM process is performed to measure the lindewidth, thereby preventing slimming of the pattern.

In this way, the disclosed overcoating composition is a composition overcoated on the previously formed photoresist pattern.

A method of forming pattern in accordance with preferred embodiments will be described in detail with reference to the accompanying drawings.

Figure 2A:
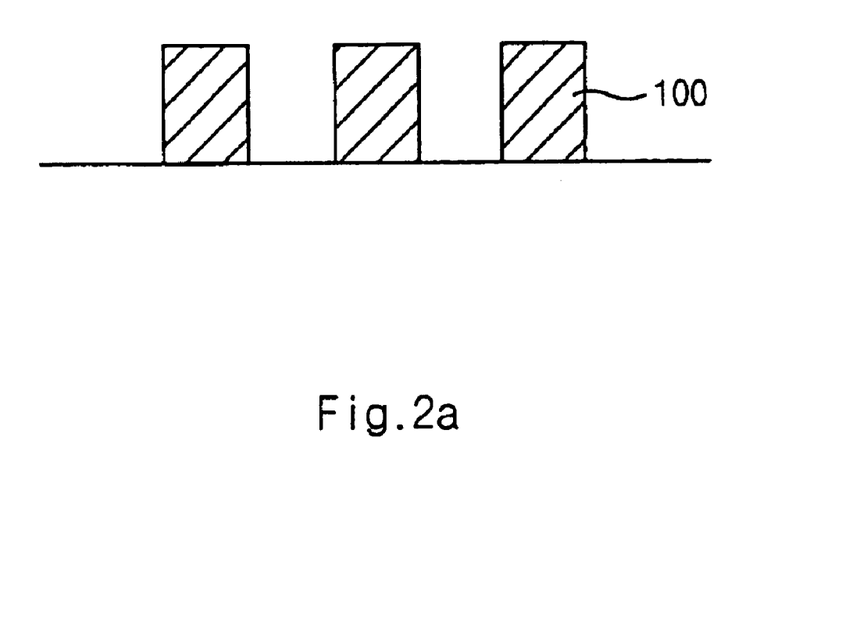
FIGS. 2a through 2d are diagram illustrating a disclosed method for forming a photoresist pattern.

Referring to FIG. 2a, a chemically amplified photoresist composition (not shown) is coated on a semiconductor substrate (not shown), and baked to form a photoresist film (not shown).

The photoresist film is exposed to light, baked, and developed to form a photoresist pattern 100.

The height of the photoresist pattern 100 coated in the step (a-1) preferably ranges from 2000 to 3000 Å.

Any of common chemically amplified photoresist can be used for the photoresist composition. Preferably, the photoresist composition comprises a photoresist polymer having a repeating unit of Formula 2:

Formula 2 wherein $X_1$, $X_2$, $Y_1$, $Y_2$, $Z_1$ and $Z_2$ individually are $CH_2$ or $CH_2CH_2$;

$R_1$, $R_3$ and $R_4$ individually are selected from the group consisting of H, substituted $C_1$–$C_{10}$ alkyl and unsubstituted $C_1$–$C_{10}$ alkyl;

$R_2$ is $C_1$–$C_{10}$ hydroxyalkyl;

R* is an acid labile protecting group;

p, q and r individually are an integer ranging from 0 to 2; and the relative ratio of a:b:c:d is in the range 5~90 mol %:5~90 mol %:0~90 mol %:0~90 mol %.

The acid labile protecting group which may be left by acid determines solution to an alkaline developer solution of PR materials. That is, the acid labile protecting group prevents the compound from dissolving in the alkaline developer solution. If the acid labile protecting group is left by acid generated by exposure to light, the PR materials may be dissolved in the developer solution. Some of conventional acid labile protecting groups are disclosed in U.S. Pat. No. 5,212,043 (May 18, 1993), WO 97/33198 (Sep. 12, 1997), WO 96/37526 (Nov. 28, 1996), EP 0 794 458 (Sep. 10, 1997), EP 0 789 278 (Aug. 13, 1997), U.S. Pat. No. 5,750,680 (May 12, 1998), U.S. Pat. No. 6,051,678 (Apr. 18, 2000), GB 2,345,286 A (Jul. 5, 2000), U.S. Pat. No. 6,132,926 (Oct. 17, 2000), U.S. Pat. No. 6,143,463 (Nov. 7, 2000), U.S. Pat. No. 6,150,069 (Nov. 21, 2000), U.S. Pat. No. 6,180,316 B1 (Jan. 30, 2001), U.S. Pat. No. 6,225,020 B1 (May 1, 2001), U.S. Pat. No. 6,235,448 B1 (May 22, 2001) and U.S. Pat. No. 6,235,447 B1 (May 22, 2001). Preferably, the acid labile protecting group is selected from the group consisting of t-butyl, tetrahydropyran-2-yl, 2-methyl tetrahydropyran-2-yl, tetrahydrofuran-2-yl, 2-methyl tetrahydrofuran-2-yl, 1-methoxypropyl, 1-methoxy-1-methyl ethyl, 1-ethoxypropyl, 1-ethoxy-1-methyl ethyl, 1-methoxyethyl, 1-ethoxyethyl, t-butoxyethyl and 1-isobutoxyethyl.

The photoresist polymer comprises a hybrid-type copolymer comprising a first polymer having a repeating unit of cyclo-olefine backbone presented by the above Formula 2 and a second polymer having a repeating unit acrylate backbone.

Preferably, the acrylate backbone comprises poly{4-[2-(4-hydroxyphenyl)-1,1,1,3,3,3-hexafluoropropyl]phenyl methacrylate/(1,1,1,3,3,3-hexafluoro-2-tert-butyl)carboxylate)isopropyl methacrylate}, poly[N-perfluoropropyl maleimide/t-butyl-5-norbornene-2-carboxylate/2-(perfluoro-octyl)ethyl methacrylate] or poly (maleic anhydride/hexafluorobutyl-5-norbornene-2-carboxylate/2,6-difluoro-methylbenzylacrylate).

The exposure light source of the step (a-2) is selected from the group consisting of ArF (193 nm), KrF (248 nm), $F_2$ (157 nm) and EUV (13 nm). The exposure energy of the step (a-2) ranges from 10 to 30 mJ/cm$^2$.

Figure 2B:
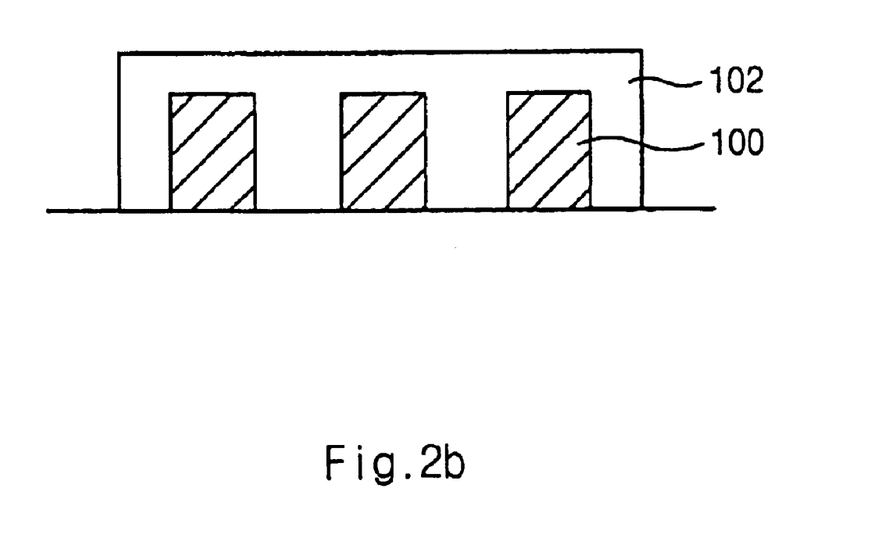

As shown in FIG. 2b, an overcoating composition 102 is coated on the photoresist pattern 100 formed by the above-described method of FIG. 2a.

The thickness of the overcoating composition ranges from 200 to 5000 Å from the top surface of the photoresist pattern.

Figure 2C:
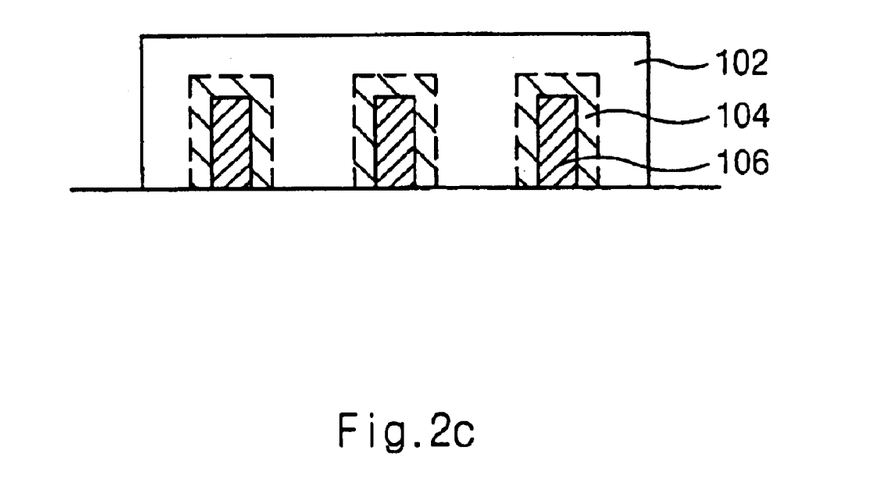

As shown in FIG. 2c, an acid diffusion bake process is performed on the overcoating composition 102 formed in FIG. 2b in order to diffuse acids on the overcoating layer into the photoresist pattern. As a result, a region 104 with acids that have impregnated the photoresist pattern is generated.

When the formed pattern is a negative pattern, acids included in the composition are diffused into the upper portion of the pattern. As a result, the upper portion of the pattern is hardened (not shown).

The bake process is preferably performed at a temperature ranging from 50 to 150° C. for 30 to 90 seconds.

Figure 2D:
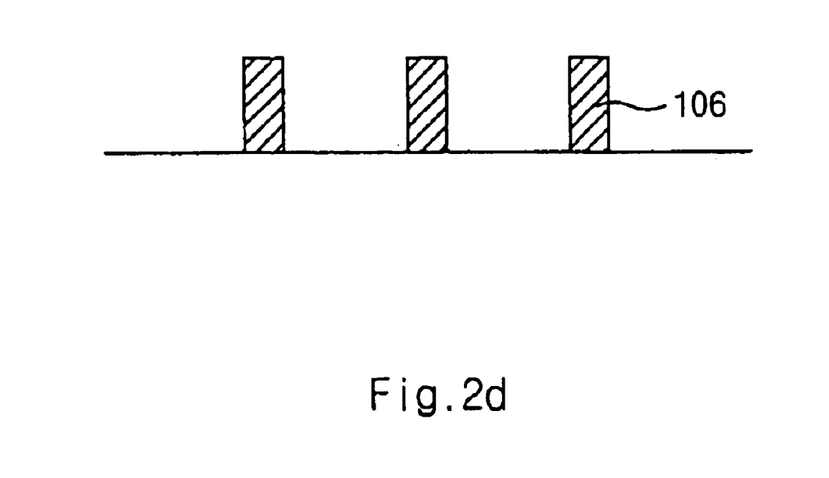

After the regions having acids in the photoresist pattern are increased by the bake process of FIG. 2c, the regions 104 having acids are removed with an alkaline developing solution to form a photoresist pattern 106 whose linewidth is reduced as shown in FIG. 2d or whose surface is hardened.

Preferably, the alkaline developing solution may be a TMAH, KOH or NaOH aqueous solution.

Since the linewidth of patterns becomes smaller in proportion to alkali treating time, a desired linewidth may be obtained by regulating treating time. If the concentration of the alkaline developing solution becomes higher, the removal speed of resist materials becomes faster. As a result, the throughput may be improved. Here, the regions having acids are preferably treated with TMAH aqueous solution of 2.38 wt % for 30 to 60 seconds.

The disclosed overcoating composition will be described in more details by referring to examples below, which are not intended to be limiting of this disclosure.

I. Preparation of Overcoating Composition

EXAMPLE 1

Preparation of Overcoating Composition (1)

Step 1. Synthesis of poly(N,N-dimethylacrylamide)

Figure 3:
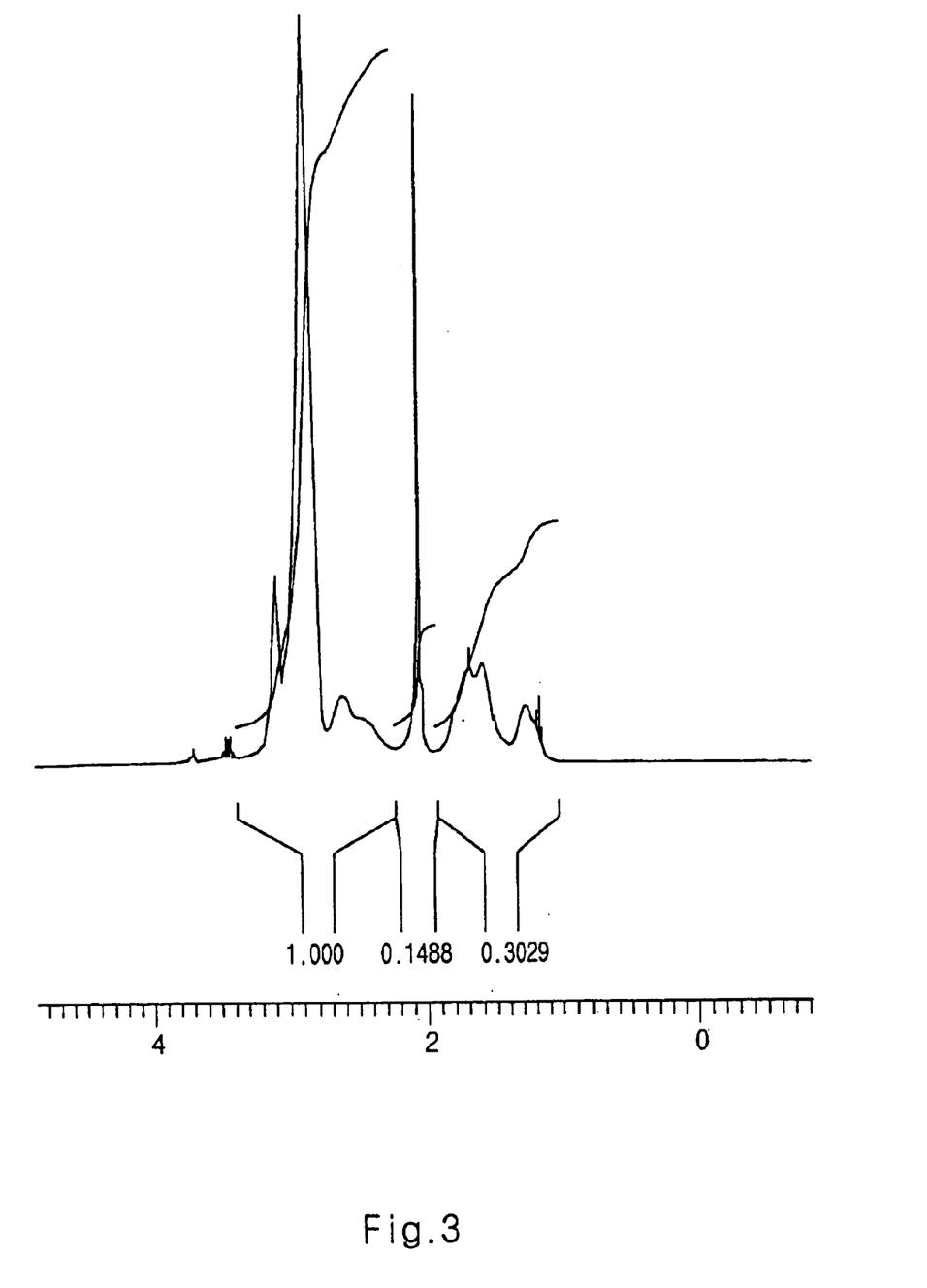
FIG. 3 is an NMR spectrum of poly(N,N-dimethylacrylamide).

To tetrahydrofuran solvent (300 g) were added N,N-dimethylacrylamide (100 g) and AIBN (5 g). The resulting mixture was reacted at 66° C. for 9 hours. Thereafter, the resulting mixture was precipitated in ethylether, and dehydrated, thereby obtaining pure poly(N,N-dimethylacrylamide) (molecular weight ~12,700, yield ~88%). The NMR spectrum of the synthesized compound was shown in FIG. 3.

Step 2. Preferred embodiment 1

To distilled water (300 g) were added poly(N,N-dimethylacrylamide) polymer (30 g) obtained from Preparation Example and p-toluenesulfonic acid (0.5 g). Then, the resulting mixture was filtered with a 0.2 μm filter, thereby obtaining a disclosed overcoating composition.

EXAMPLE 2

Preparation of Overcoating Composition (2)

To distilled water (300 g) were added polyvinylpyrrolidone (molecular weight 10,000) (30 g)(Aldrich Co.) and p-toluenesulfonic acid (0.5 g). Then, the resulting mixture was filtered with a 0.2 μm filter, thereby obtaining a disclosed overcoating composition.

II. Formation of Positive Photoresist Pattern

EXAMPLE 3

An ArF antireflective coating (hereinafter, referred to as "BARC") film (DHRC-A20)(Dongjin SemiChem Co. Ltd.) was coated at a thickness of 330 Å on a wafer. A positive ArF photoresist (DHA-H150)(Dongjin SemiChem Co. Ltd.) was coated at a thickness of 2400 Å thereon. The resulting structure was exposed using an ArF exposer (ASML Co. Ltd.) to light, and developed, thereby obtaining the positive photoresist pattern of FIG. 4a (linewidth ~112 nm).

Figure 4A:
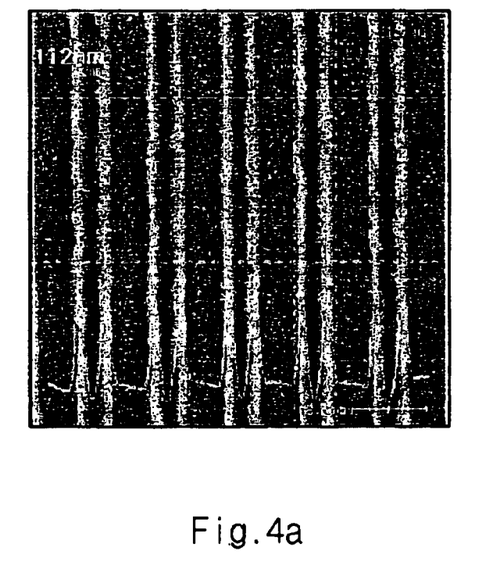
FIGS. 4a and 4b are SEM photographs of a photoresist pattern obtained from Example 3.

The overcoating composition obtained from the step 2 of Example 1 was coated at a thickness of 3000 Å on the pattern of FIG. 4a. The resulting structure was baked at 150° C. for 30 seconds. After the baking process, the resulting structure was developed with TMAH solution of 2.38 wt %, thereby obtaining the pattern of FIG. 4b (linewidth ~86 nm).

Figure 4B:
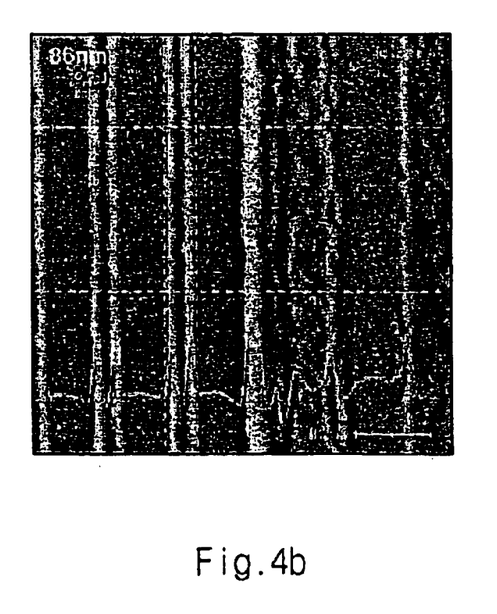

The linewidth of the pattern of FIG. 4b was shown to be reduced to 26 nm when compared to that of FIG. 4a. Accordingly, the resolving power of patterns may be increased by the disclosed method.

EXAMPLE 4

An ArF BARC film (DHRC-A20) was coated at a thickness of 330 Å on a wafer. A positive ArF photoresist (DHA-H150) was coated at a thickness of 2400 Å thereon. The resulting structure was exposed using an ArF exposer to light, and developed, thereby obtaining the positive photoresist pattern of FIG. 5a (linewidth ~111 nm).

Figure 5A:
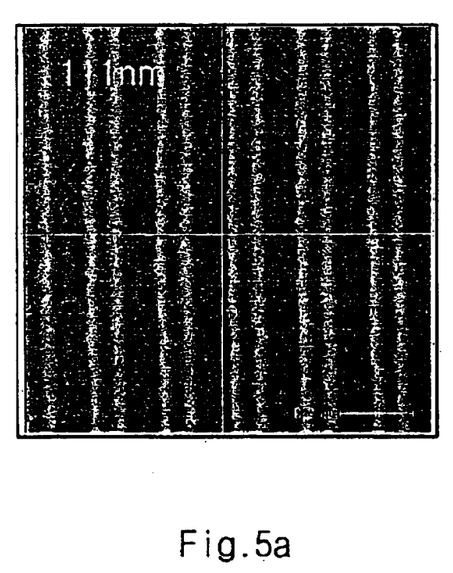
FIGS. 5a and 5b are SEM photographs of a photoresist pattern obtained from Example 4.

The overcoating composition obtained from Example 2 was coated at a thickness of 3000 Å from the top surface of the pattern of FIG. 5a. The resulting structure was baked at 150° C. for 30 seconds. After the baking process, the resulting structure was developed with TMAH solution of 2.38 wt %, thereby obtaining the pattern of FIG. 5b (linewidth ~88 nm).

Figure 5B:
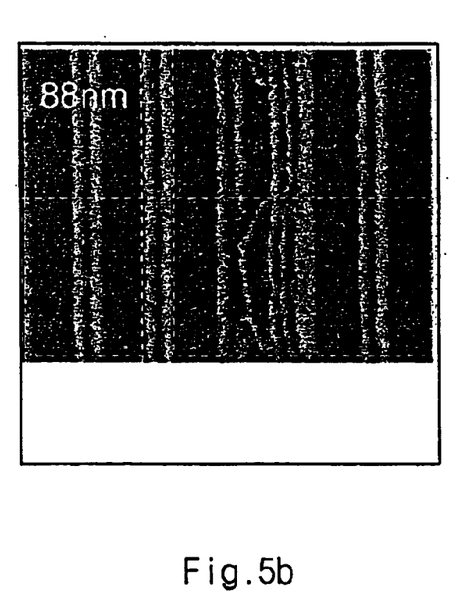

The linewidth of the pattern of FIG. 5b was shown to be reduced to 23 nm when compared to that of FIG. 5a. Accordingly, the resolving power of patterns may be increased by the disclosed method.

EXAMPLE 5

An photoresist (AX1020P)(Clariant Co. Ltd.) was coated on a wafer. The resulting structure was baked at 120° C. for 90 seconds to form a photoresist film. The photoresist film was exposed using an ArF exposer to light, and heated at 120° for 90 seconds. The resulting mixture was developed with TMAH aqueous solution of 2.38 wt %, thereby obtaining the positive photoresist pattern of FIG. 6a (linewidth ~100 nm).

Figure 6A:
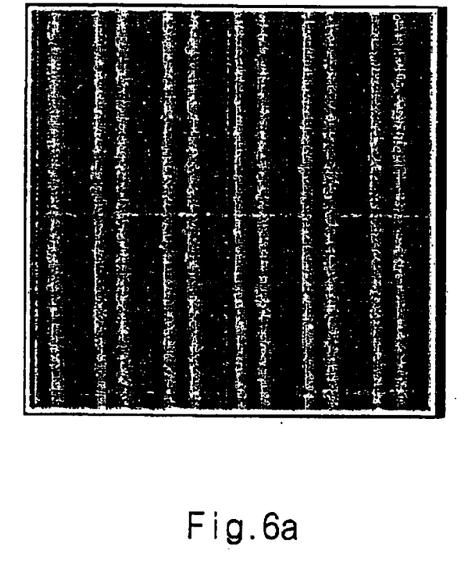
FIGS. 6a and 6b are SEM photographs of a photoresist pattern obtained from Example 5.

The overcoating composition obtained from Example 2 was coated at a thickness of 2400 Å on the photoresist pattern of FIG. 6a. The resulting structure was baked at 120° C. for 90 seconds to diffuse acids. Then, the resulting structure was developed with TMAH aqueous solution of 2.38 wt % for 40 seconds, thereby obtaining the pattern having linewidth of 80 nm (see FIG. 6b).

Figure 6B:
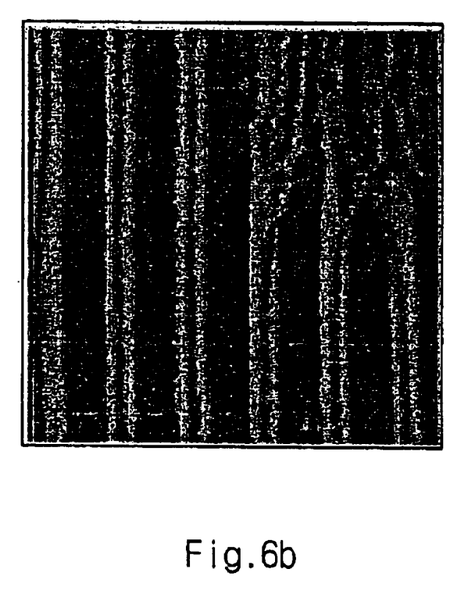

The linewidth of the pattern of FIG. 6b was shown to be reduced to 20 nm when compared to that of FIG. 6a. Accordingly, the resolving power of patterns may be increased by the disclosed method.

III. Formation of Negative Photoresist Pattern

EXAMPLE 6

An ArF antireflective coating film (DHRC-A20)(Dongjin SemiChem Co. Ltd.) was coated at a thickness of 330 Å on a wafer. A negative ArF photoresist (GX02)(Dongjin Semi-Chem Co. Ltd.) was coated at a thickness of 2400 Å thereon. The resulting structure was exposed using an ArF exposer (ASML Co. Ltd.) to light, and developed, thereby obtaining the negative photoresist pattern (linewidth ~112 nm).

Figure 7A:
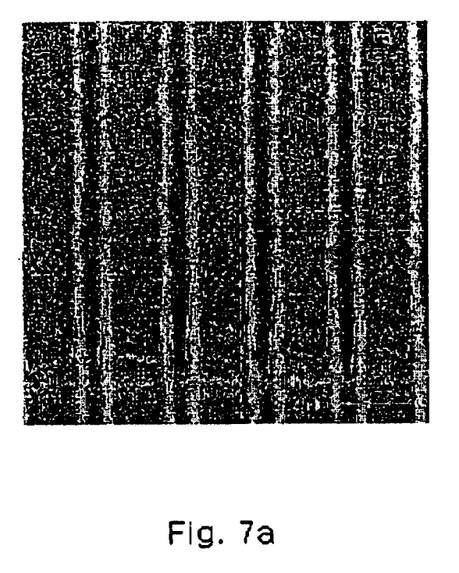
FIGS. 7a and 7b are SEM photographs of a photoresist pattern obtained from Example 6.

The overcoating composition obtained from the step 2 of Example 1 was coated at a thickness of 3000 Å from the top surface of the negative pattern. The resulting structure was baked at 150° C. for 2 minutes. After the baking process, the resulting structure was developed with distilled water, thereby obtaining the pattern of FIG. 7a (linewidth ~103 nm).

Figure 7B:
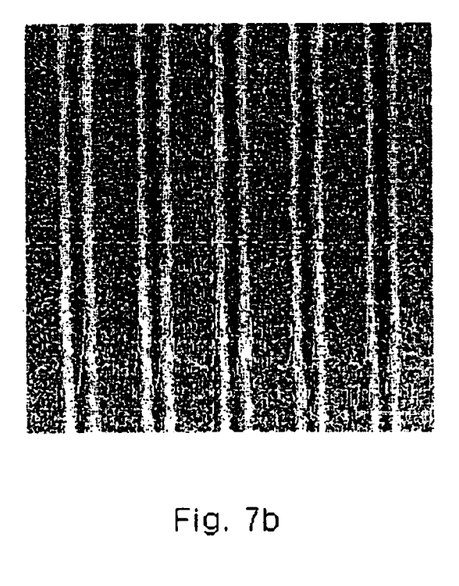

While the above negative photoresist pattern was exposed to electronic beam for 30 seconds using SEM equipment at 800V of accelerating voltage and 120K of magnification, the decrease in linewidth of the pattern was measured. Referring to FIG. 7b, the slimming phenomenon was not shown in the pattern of 103 nm.

COMPARATIVE EXAMPLE 1

An ArF antireflective coating film (DHRC-A20)(Dongjin SemiChem Co. Ltd.) was coated at a thickness of 330 Å on a wafer. An ArF photoresist (GX02) was coated thereon.

Figure 8A:
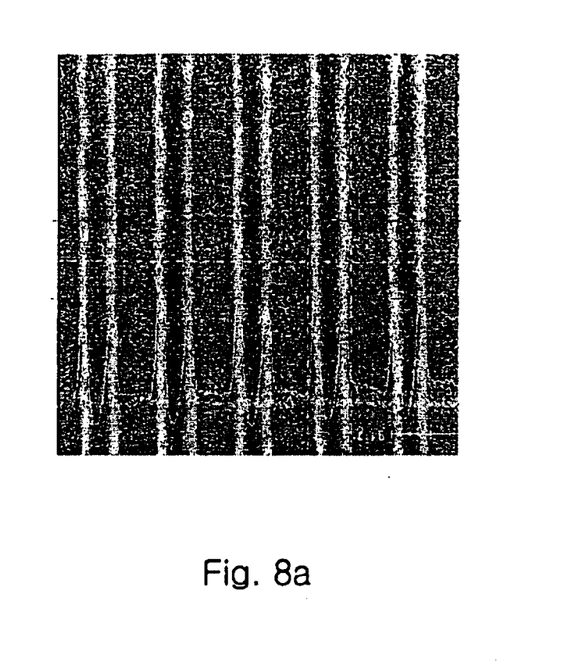
FIGS. 8a and 8b are SEM photographs of a photoresist pattern obtained from Comparative Example 1.

The resulting structure was exposed using an ArF exposer (ASML Co. Ltd.) to light, and developed, thereby obtaining the positive photoresist pattern of FIG. 8a (linewidth ~112 nm).

While the above photoresist pattern was exposed to electronic beam for 30 seconds using SEM equipment at 800V of accelerating voltage and 120K of magnification, the decrease in linewidth of the pattern was measured.

Figure 8B:
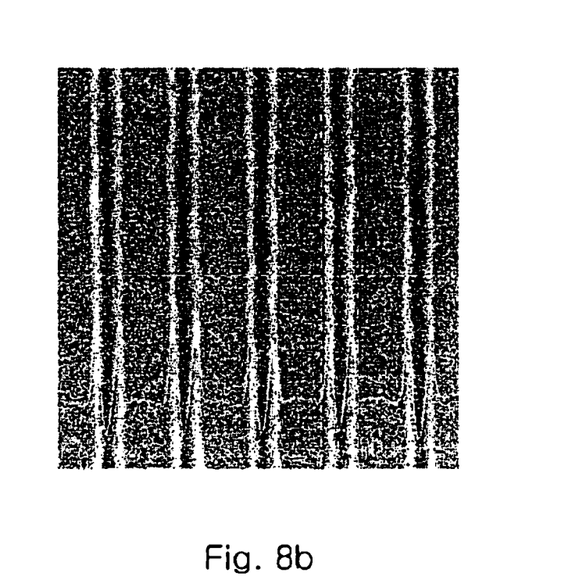

Referring to FIG. 8b, the slimming phenomenon was shown in the pattern of 91 nm.

As discussed earlier, the linewidth of patterns may be easily reduced by a simple wet development process without new equipment, thereby decreasing costs. In addition, transistor linewidth of DRAM or MPU may be reduced, thereby improving operation speed of semiconductor speed, and bit-line linewidth of DRAM may be reduced, thereby improving capacitance. In case of negative pattern, the slimming phenomenon of linewidth can be prevented in a subsequent linewidth measurement process using SEM, thereby improving reproductivity and reliability of the resulting photoresist patterns.

What is claimed is:

1. A method for forming a photoresist pattern comprising:
   (a) coating a chemically amplified photoresist composition on a semiconductor substrate and baking the substrate to form a photoresist film;
   (b) exposing the photoresist film to light;
   (c) baking the photoresist film;
   (d) developing the photoresist film to form a photoresist pattern;
   (e) coating an overcoating composition on the entire photoresist pattern to form an overcoating layer;
   (f) baking the overcoating layer; and
   (g) developing the overcoating layer with an alkaline developing solution; wherein the overcoating composition comprises:
      (i) a water-soluble polymer being one of a compound of Formula 1 or polyvinylpyrrolidone:

Formula 1 wherein R' is H or $CH_3$; $R_5$ and $R_6$ individually are H or a $C_1$–$C_3$ alkyl group; and n is an integer from 50 to 150;
      (ii) an acidic compound; and
      (iii) water.

2. The method according to claim 1, wherein a height of the photoresist pattern obtained from step (d) ranges from 2000 to 3000 Å.

3. The method according to claim 1, wherein a thickness of the overcoating layer in step (e) ranges from 200 to 5000 Å from the top surface of the photoresist pattern of the step (d).

4. The method according to claim 1, wherein the bake process of step (f) is performed at a temperature ranging from 50 to 150° C. for 30 to 90 seconds.

5. The method according to claim 1, wherein the alkaline developing solution of step (g) is TMAH, KOH or NaOH aqueous solution.

6. The method according to claim 1, wherein the chemically amplified photoresist composition comprises a photoresist polymer having a repeating unit of Formula 2:

Formula 2 wherein $X_1$, $X_2$, $Y_1$, $Y_2$, $Z_1$ and $Z_2$ individually are $CH_2$ or $CH_2CH_2$;

$R_1$, $R_3$ and $R_4$ individually are selected from the group consisting of H, substituted $C_1$–$C_{10}$ alkyl and unsubstituted $C_1$–$C_{10}$ alkyl;

$R_2$ is $C_1$–$C_{10}$ hydroxyalkyl;

R* is an acid labile protecting group;

p, q and r individually are an integer ranging from 0 to 2; and the relative ratio of a:b:c:d is in the range 5~90 mol %:5~90 mol %:0~90 mol %:0~90 mol %.

7. The method according to claim 6, wherein the photoresist polymer is a hybrid-type copolymer further comprising a polymer having a repeating acrylate unit.

8. The method according to claim 7, wherein the second polymer comprising the acrylate repeating unit is poly{4-[2-(4-hydroxyphenyl)-1,1,1,3,3,3-hexafluoropropyl]phenyl methacrylate/(1,1,1,3,3,3-hexafluoro-2-tert-butyl carboxylate)isopropyl methacrylate}, poly[N-perfluoropropyl maleimide/t-butyl-5-norbornene-2-carboxylate/2-(perfluoro-octyl)ethyl methacrylate] or poly(maleic anhydride/hexafluorobutyl-5-norbornene-2-carboxylate/2,6-difluoro-methylbenzylacrylate).

9. The method according to claim 1, wherein the exposure light source of step (b) is selected from the group consisting of ArF (193 nm), KrF (248 nm), F2 (157 nm) and EUV (13 nm).

10. The method according to claim 1, wherein the exposure energy of step (b) ranges from 10 to 30 mJ/cm$^2$.

11. The method according to claim 1, wherein molecular weights of compound of the Formula 1 ranges from 5000 to 15000.

12. The method according to claim 1, wherein the water soluble polymer represented by Formula 1 is poly (N,N-dimethylacrylamide).

13. The method according to claim 1, wherein (ii) the acidic compound is an organic sulfonic acid.

14. The method according to claim 13, wherein the organic sulfonic acid is a p-toluenesulfonic acid monohydrate.

15. The method according to claim 1, wherein (ii) the acidic compound is present in an amount ranging from 2 to 20 wt % based on the water-soluble polymer.

16. The method according to claim 1, wherein (iii) the water is present in an amount ranging from 500 to 4000 wt % based on the water-soluble polymer.

* * * * *